(12) United States Patent
Akutsu

(10) Patent No.: US 6,518,095 B1
(45) Date of Patent: Feb. 11, 2003

(54) PROCESS FOR PRODUCING SEMICONDUCTOR DEVICE

(75) Inventor: Yasushi Akutsu, Kanuma (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 09/548,347

(22) Filed: Apr. 12, 2000

(30) Foreign Application Priority Data

Apr. 20, 1999 (JP) .............................. 11-112786

(51) Int. Cl.⁷ .............................................. H01L 21/44
(52) U.S. Cl. ..................... 438/118; 438/119; 438/125
(58) Field of Search ................................ 438/108, 118, 438/119, 124, 125, 126, 127

(56) References Cited

U.S. PATENT DOCUMENTS 5,635,010 A  6/1997  Pepe et al.
5,994,165 A * 11/1999 Yoshino et al. ............. 438/106

FOREIGN PATENT DOCUMENTS

| EP | 0 265 077 A2 | 4/1988 |
| EP | 0 880 170 A2 | 11/1998 |
| EP | 1 067 598 A1 | 1/2001 |
| JP | 02121345 | 5/1990 |
| JP | A 7-297227 | 11/1995 |
| JP | A 10-223686 | 8/1998 |
| WO | WO 00/45430 A | 8/2000 |

* cited by examiner

Primary Examiner—Kevin M. Picardat
(74) Attorney, Agent, or Firm—Oliff & Berridge, PLC

(57) ABSTRACT

A process for producing a semiconductor device comprises mounting of a semiconductor element on a circuit board via a thermosetting resin-based adhesive by means of a thermocompression process, wherein the thermocompression process is carried out under a first set of conditions (pressure=$P^1$ and temperature=$T^1$) designed to eliminate voids present in the adhesive, and subsequently under a second set of conditions (pressure=$P^2$ and temperature=$T^2$) designed to bring about curing of the thermosetting resin, provided that pressure $P^2$ of the second set of conditions is set to a lower level than the pressure $P^1$ of the first set of conditions.

5 Claims, 2 Drawing Sheets

PROCESS FOR PRODUCING SEMICONDUCTOR DEVICE

BACKGROUND OF THE INVENTION

1. Field of the Invention

The present invention relates to a semiconductor device having a semiconductor element, such as a bare chip, chip size package, or IC module, mounted onto a circuit board by means of a thermosetting resin adhesive.

2. Description of the Related Art

Mounting of a semiconductor element, such as a bare IC chip, on a circuit board is typically carried out by applying a thermosetting insulating adhesive of liquid or film form, such as an epoxy-based resin, between the circuit board and the semiconductor element, and subjecting the semiconductor element to thermocompression with a bonding tool equipped with heating means to effect mounting thereof.

A problem encountered with mounting a semiconductor element provided with tiny bumps to a circuit board having a fine conductor pattern is that voids present in the cured adhesive reduce the adhesive strength and lower connection reliability in humidity resistance tests and heat shock resistance tests. Accordingly, conditions for thermocompression are selected so as to substantially eliminate voids in the adhesive and ensure a reliable degree of adhesive strength.

Conditions for thermocompression include one step conditions, namely, setting the factors of temperature, pressure and time to constant optimal values (for example, constant temperature of 180° C., constant pressure of 10 kg/cm² per IC chip, and constant time of 20 seconds); two step conditions, namely, varying the temperature profile under constant pressure, especially, temperature elevation in two steps (for example, under constant pressure of 10 kg/cm², temperature 100° C./time=10 seconds→temperature=200° C./time=10 seconds); etc.

However, a problem encountered with the aforementioned one step conditions, as well as with two step conditions involving varying the temperature profile under constant pressure, is failure to eliminate to a sufficient extent voids present in the adhesive.

SUMMARY OF THE INVENTION

The present invention is intended to solve the problems of the prior art described above, and has as an object to provide a process for producing a semiconductor device, comprising mounting of a semiconductor element on a circuit board via a thermosetting resin adhesive, whereby curing of the adhesive may be brought about in such a way that residual voids are eliminated, thereby affording excellent connection reliability.

Focusing upon variation in the pressure profile, a factor having insufficiently taken into consideration, the inventor perfected the present invention on the basis of the discovery that by first conducting compression under relatively high pressure to substantially eliminate voids present in the adhesive, and then proceeding to cure the thermosetting resin under compression at a pressure lower than the pressure in the preceding step, it is possible to significantly reduce residual voids in the cured adhesive, thereby affording more excellent connection reliability.

Specifically, the invention provides a process for producing a semiconductor device, comprising mounting of a semiconductor element on a circuit board via a thermosetting resin-based adhesive by means of a thermocompression process, wherein the thermocompression process is carried out under a first set of conditions (pressure=$P^1$ and temperature=$T^1$) designed to eliminate voids present in the adhesive, and subsequently under a second set of conditions (pressure=$P^2$ and temperature=$T^2$) designed to bring about curing of the thermosetting resin, the pressure $P^2$ of the second set of conditions being set to a lower level than the pressure $P^1$ of the first set of conditions.

These and other objects, features and advantages of the present invention are described in or will become apparent from: the following detailed description of the invention.

DETAILED DESCRIPTION OF THE INVENTION

The present invention is a process for producing a semiconductor device, comprising mounting of a semiconductor element on a circuit board via a thermosetting resin-based adhesive by means of a thermocompression process.

According to the present invention, the conditions for thermocompression are composed of a first set of conditions (pressure=$P^1$ and temperature=$T^1$) designed to eliminate voids present in the adhesive, and a subsequent second set of conditions (pressure=$P^2$ and temperature=$T^2$) designed to cure the thermosetting resin, the pressure $P^2$ of the second set of conditions being set to a lower level than the pressure $P^1$ of the first set of conditions. In this way, compression is first conducted under relatively high pressure ($P^1$) in order to eliminate voids present in the adhesive, and subsequently under lower pressure ($P^2$) to bring about curing of the thermosetting resin, thereby significantly reducing residual voids in the cured adhesive to achieve more excellent connection reliability. A possible justification for setting $P^1$ higher than $P^2$ is given below.

When expelling from an adhesive arranged between a circuit board and a semiconductor element any voids that might be present in the fine conductor pattern of the circuit board, excessively low melt viscosity of the adhesive will make it difficult to expel the voids. It is therefore necessary to expel voids while the melt viscosity of the adhesive is relatively high. This requires a high pressure setting (first set of conditions for thermocompression). On the other hand, when the adhesive from which the voids have been expelled is subjected to curing of the thermosetting resin contained therein, application of excessively high pressure creates shrinkage of the resin with curing and concentration of compressing force at the bumps on the semiconductor element, resulting in deformation of the fine conductor pattern of the circuit board. Accordingly, in the present invention, $P^2$ is set to lower pressure than $P^1$.

Figure 1A:
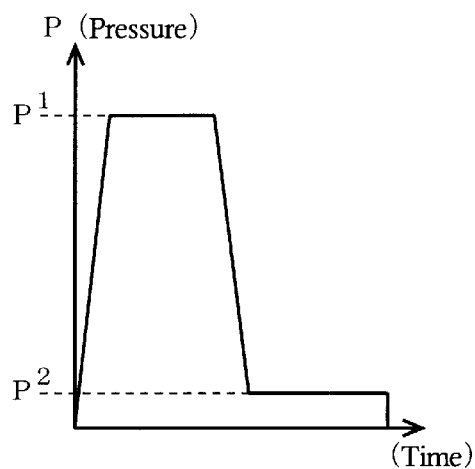
FIGS. 1A to 1E are illustrative diagrams showing variations in the pressure profile employed in the production process of the present invention.
Figure 1D:
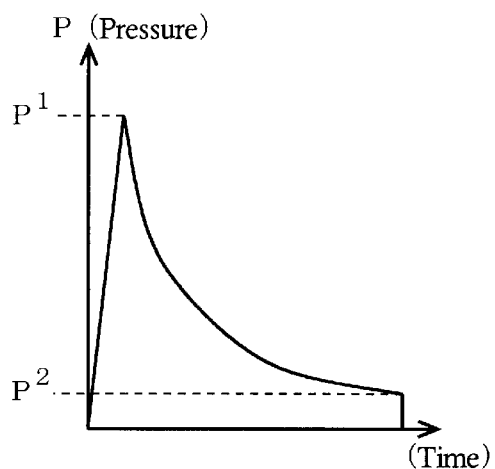
Figure 1B:
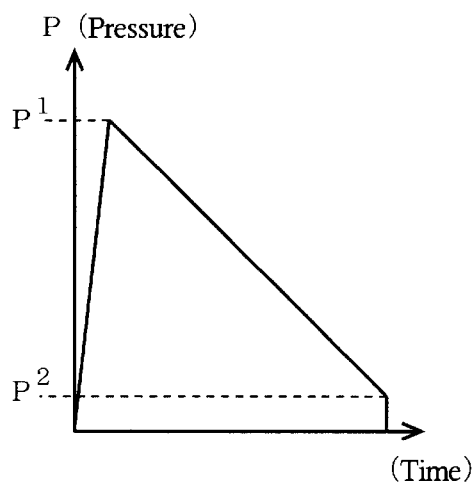
Figure 1E:
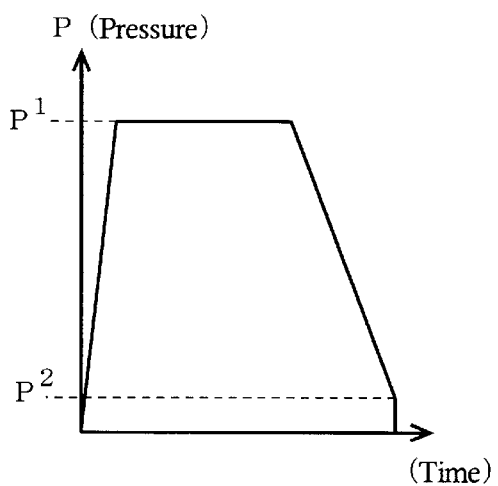
Figure 1C:
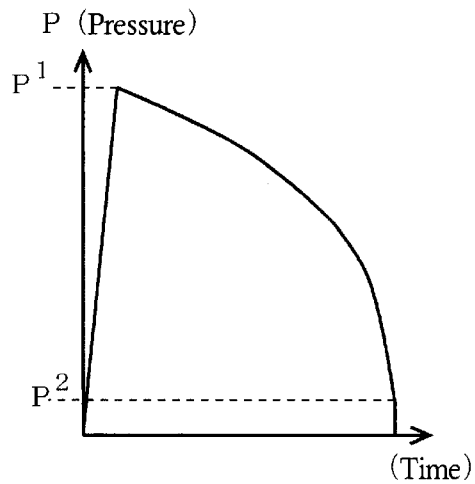

In the present invention, examples of thermocompression pressure profile patterns for pressure $P^1$ of the first set of conditions and pressure $P^2$ of the second set of conditions fulfilling the relation $P^1 > P^2$ (>0) include a stepwise pattern (FIG. 1A), a linear pattern (FIG. 1B), curved patterns (FIG. 1C, FIG. 1D), etc. In terms of efficient elimination of voids, a stepwise pattern (FIG. 1A) is preferred. A stepwise pattern including three or more pressure steps may be employed as well. Pressure profiles that are combinations of the above patterns are also acceptable (see FIG. 1E, for example).

Figure 2A:
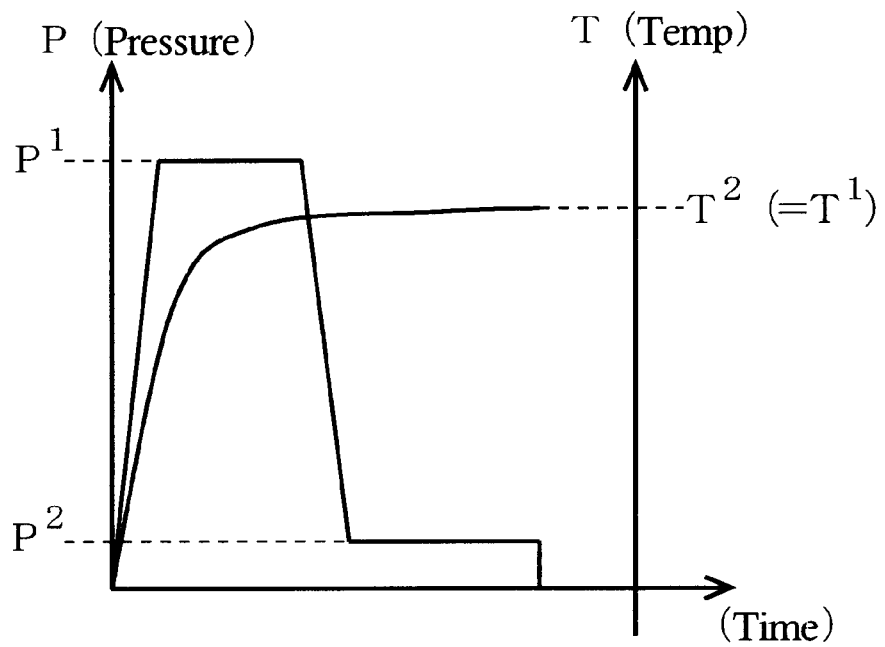
FIGS. 2A and 2B are illustrative diagrams showing variations in the thermocompression conditions employed in the mounting of a semiconductor element on the circuit board.
Figure 2B:
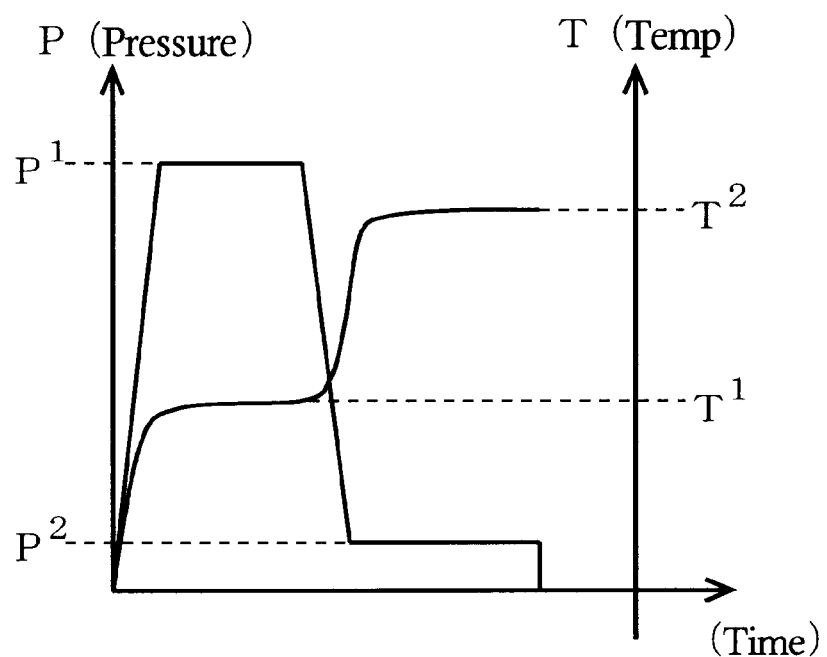

In the production process of the present invention, temperature conditions for thermocompression (namely, temperature $T^1$ of the first set of conditions and temperature $T^2$ of the second set of conditions) may be set in the same manner as in the conventional art. For example, when a pressure profile is set as shown in FIG. 2A, temperature can be kept constant ($T^1=T^2$). In terms of efficient elimination of voids, in a preferred example, the melt viscosity of the adhesive at temperature $T^1$ will be somewhat higher than the melt viscosity during the initial stage of curing at temperature $T^2$, as shown in FIG. 2B, employing a stepwise pressure profile under the condition $T^1<T^2$, as shown in FIG. 2B.

Specific value ranges for $P^1$, $P^2$, $T^1$, $T^2$, and thermocompression time in the process of the present invention will depend upon the factors such as the type of adhesive being used; where the adhesive is epoxy resin based, example settings are $P^1=5$ to 15 kfg/cm$^2$, $T^1=80$ to 120° C., 5 to 15 seconds for the first set of conditions, and $P^2=0.5$ to 3 kfg/cm$^2$, $T^2=180$ to 220° C., 5 to 15 seconds for the second set of conditions.

According to the process of the present invention, the thermosetting resin-based adhesive may be any of the thermosetting resin-based adhesives typically employed in the conventional art for mounting semiconductor elements on circuit boards. The adhesive may be provided as a liquid, paste, or film. Anisotropically conductive adhesives containing conductive particles can be used as well, as can insulating adhesives devoid of conductive particles.

The circuit board can be any of those employed conventionally in the art. The semiconductor element can be a bare chip, chip size package, IC module, or other element known in the conventional art.

According to the process of the present invention described hereinabove, in the instance of, for example, mounting of bare chip on a circuit board via a typical adhesive, voidless connection can be achieved due to the high initial pressure during thermocompression. Since the pressure applied during curing is relatively lower than the initial pressure during thermocompression, deformation of the circuit pattern can be largely prevented. Thus, the process of the present invention provides semiconductor devices in which semiconductor elements are mounted at a high connection reliability on a circuit board.

EXAMPLES

The invention is described in greater detail through the following examples.

Working Examples 1 to 6, Comparative Examples 1 and 2 Bare chips (6 mm square) were mounted on circuit boards (lead copper pattern width 100 μm; pattern pitch 150 μm) using an anisotropically conductive adhesive film for bare chip mounting (FP10425, available from Sony Chemicals Corp.), carrying out mounting under the conditions indicated in Table 1 on an 80° C. pressure stage, to produce semiconductor devices.

Evaluation

The resultant semiconductor devices were examined to ascertain the presence of voids in the adhesive (by visual examination under the microscope); the number of hours of treatment in a pressure cooker (PCT (121° C., 2 atm)) and the number of heat shock cycles (H/S (−55° C. (15 min) ←→125° C. (15 min)) for which humidity resistance equivalent to Jedec level 3 (30° C., 70% RH, 168 hr) was sustained. Results are shown in Table 1.

TABLE 1

| | | Thermocompression conditions | | Jedec level 3 | |
|---|---|---|---|---|---|
| | | Pressure/temp/time (kgf/cm$^2$)(° C.) (sec) | Voids | PCT (hr) | H/S (cycle) |
| Comparative Ex. 1 | Constant | 10/180/20 | numerous | NG | NG |
| Comparative Ex. 2 | 1$^{st}$ set of conditions | 10/100/10 | present | 40 | 200 |
| | 2$^{nd}$ set of conditions | 10/200/10 | | | |
| Working Ex. 1 | 1$^{st}$ set of conditions | 10/180/10 | few | 60 | 300 |
| | 2$^{nd}$ set of conditions | 1/180/10 | | | |
| Working Ex. 2 | 1$^{st}$ set of conditions | 10/100/10 | Absent | <500 | <1000 |
| | 2$^{nd}$ set of conditions | 1/200/10 | | | |
| Working Ex. 3 | 1$^{st}$ set of conditions | 10/100/15 | absent | <500 | <1000 |
| | 2$^{nd}$ set of conditions | 1/200/5 | | | |
| Working Ex. 4 | 1$^{st}$ set of conditions | 10/100/5 | absent | <500 | <1000 |
| | 2$^{nd}$ set of conditions | 1/200/15 | | | |
| Working Ex. 5 | 1$^{st}$ set of conditions | 10/30/10 | substantially absent | 60 | 300 |
| | 2$^{nd}$ set of conditions | 1/200/10 | | | |
| Working Ex. 6 | 1$^{st}$ set of conditions | 10/100/10 | absent | <500 | <1000 |
| | 2$^{nd}$ set of conditions | 5/150/10 | | | |
| | 3$^{rd}$ set of conditions | 1/200/10 | | | |

As will be apparent from Table 1, Comparative Example 1, an example involving constant thermocompression conditions, did not achieve humidity resistance equivalent to Jedec level 3. Comparative Example 2, an example of varied temperature profile (stepwise elevation) under constant pressure, gave better results than Comparative Example 1.

On the other hand, Working Example 1, an example of varied pressure profile (stepwise decline) at constant temperature, showed a significant reduction in voids in comparison with Comparative Example 2, and improved PCT and H/S results.

In Working Example 2, an example employing the same pressure profile as Working Example 1 but additionally introducing variation in the temperature profile (stepwise elevation), voids were eliminated, and PCT and H/S results were improved. From the results for Working Examples 1 and 2, it will be apparent that varying temperature profile (stepwise elevation) in addition to the pressure profile (stepwise decline) is favorable.

Working Examples 3 and 4 are examples involving lengthened or shortened duration for the first set of conditions and second set of conditions in Working Example 2. From these results, it will be apparent that shortening or lengthening time by about 50% leaves the results unchanged.

Working Example 5 is an example involving a lower first set of condition temperature setting than in Working Example 2. While there were no problems in practical terms of any of the evaluated items versus Working Example 2, PCT and H/S results were slightly poorer. It will therefore be apparent that the temperature of 100° C. is preferred to one of 30° C. during the initial stage of thermocompression (first set of conditions).

Working Example 6 is an example of dividing conditions for thermocompression into three sets of conditions (stepwise reduction in pressure and stepwise elevation in temperature). It will be apparent that conditions for thermocompression can be successfully divided into two or more steps.

Working Example 7

Semiconductor devices were produced in the same manner as in Working Example 2, except for substituting an anisotropically conductive adhesive film for liquid crystal display elements (CP7131, available from Sony Chemicals Corp.) for the anisotropically conductive adhesive film (FP10425, available from Sony Chemicals Corp.), and were evaluated. No voids were observed in the adhesive of the resultant semiconductor devices. PCT treatment time was 500 hr or more and H/S cycle count was 1000 or more, presenting no problems in practical terms.

Working Example 8

Semiconductor devices were produced in the same manner as in Working Example 2, except for substituting the insulating liquid epoxy adhesive given in Table 2 for the anisotropically conductive adhesive film (FP10425, available from Sony Chemicals Corp.), and were evaluated. No voids were observed in the adhesive of the resultant semiconductor devices. PCT treatment time was 300 hr and H/S cycle count was 700, presenting no problems in practical terms.

TABLE 2

| Component | wt % |
|---|---|
| Epoxy resin (EP630, available from Yuka Shell Epoxy) | 60 |
| Silane coupling agent (A187, available from Nippon Yunika) | 3 |
| Curing Agent (HX3941HP, available from Asahi Chiba) | 37 |

Working Example 9

Semiconductor devices were produced in the same manner as in Working Example 2, except for substituting the anisotropically conductive liquid epoxy adhesive given in Table 3 for the anisotropically conductive adhesive film (FP10425, available from Sony Chemicals Corp.), and were evaluated. No voids were observed in the adhesive of the resultant semiconductor devices. PCT treatment time was 350 hr and H/S cycle count was 750, presenting no problems in practical terms.

TABLE 3

| Component | wt % |
|---|---|
| Epoxy resin (EP630, available from Yuka Shell Epoxy) | 60 |
| Silane coupling agent (A187, available from Nippon Yunika) | 3 |
| Curing Agent (HX3941HP, available from Asahi Chiba) | 32 |
| Metal coated resin particles (5 μm diameter) | 5 |

Working Example 10

Semiconductor devices were produced in the same manner as in Working Example 2, except for substituting an insulating epoxy adhesive film having the formulation given in Table 4 for the anisotropically conductive adhesive film:. (FP10425, available from Sony Chemicals Corp.), and were evaluated. No voids were observed in the adhesive of the resultant semiconductor devices. PCT treatment time was 250 hr and H/S cycle count was 500, presenting no problems in practical terms.

TABLE 4

| Component | wt % |
|---|---|
| Epoxy resin (EP1009, available from Yuka Shell Epoxy) | 60 |
| Silane coupling agent (A187, available from Nippon Yunika) | 3 |
| Curing Agent (HX3941HP, available from Asahi Chiba) | 37 |

According to the present invention, during production of a semiconductor device by mounting of a semiconductor element on a circuit board via a thermosetting resin adhesive, the adhesive is cured in such a way as to eliminate voids, providing more excellent connection reliability.

The entire disclosure of the specification, the claims, the drawings and the summary of Japanese Patent Application No. 11-112786 filed on Apr. 20, 1999 is hereby incorporated by reference.

What is claimed is:

1. A process for producing a semiconductor device, comprising:

connecting a semiconductor element to a circuit board via a thermosetting resin-based adhesive by means of a thermo-compression process;

carrying out the thermo-compression process under a first set of conditions (pressure=$P^1$ and temperature=$T^1$) designed to eliminate voids present in the adhesive, and subsequently under a second set of conditions (pressure=$P^2$ and temperature=$T^2$) designed to bring about curing of the thermosetting resin; and setting the pressure $P^2$ of the second set of conditions at a lower level than the pressure $P^1$ of the first set of conditions, wherein $P^1$ and $P^2$ have a stepwise pressure profile.

2. A process for producing a semiconductor device, comprising:

connecting a semiconductor element to a circuit board via a thermosetting resin-based adhesive by means of a thermo-compression process;

carrying out the thermo-compression process under a first set of conditions (pressure=$P^1$ and temperature=$T^1$) designed to eliminate voids present in the adhesive, and subsequently under a second set of conditions (pressure=$P^2$ and temperature=$T^2$) designed to bring about curing of the thermosetting resin; and setting the pressure $P^2$ of the second set of conditions at a lower level than the pressure $P^1$ of the first set of conditions, wherein $T^1$ and $T^2$ have a stepwise temperature profile.

3. A process for producing a semiconductor device, comprising:

connecting a semiconductor element to a circuit board via a thermosetting resin-based adhesive by means of a thermo-compression process;

carrying out the thermo-compression process under a first set of conditions (pressure=$P^1$ and temperature=$T^1$) designed to eliminate voids present in the adhesive, and subsequently under a second set of conditions (pressure=$P^2$ and temperature=$T^2$) designed to bring about curing of the thermosetting resin; and setting the pressure $P^2$ of the second set of conditions at a lower level than the pressure $P^1$ of the first set of conditions, wherein the semiconductor element is a bare chip, chip size package, or IC module.

4. A process for producing a semiconductor device, comprising:

connecting a semiconductor element to a circuit board via a thermosetting resin-based adhesive by means of a thermo-compression process;

carrying out the thermo-compression process under a first set of conditions (pressure=$P^1$ and temperature=$T^1$) designed to eliminate voids present in the adhesive, and subsequently under a second set of conditions (pressure=$P^2$ and temperature=$T^2$) designed to bring about curing of the thermosetting resin;

setting the pressure $P^2$ of the second set of conditions at a lower level than the pressure $P^1$ of the first set of conditions; and setting the temperature $T^2$ to a higher temperature than $T^1$, wherein $P^1$ and $P^2$ have a stepwise pressure profile.

5. A process for producing a semiconductor device, comprising:

connecting a semiconductor element to a circuit board via a thermosetting resin-based adhesive by means of a thermo-compression process;

carrying out the thermo-compression process under a first set of conditions (pressure=$P^1$ and temperature=$T^1$) designed to eliminate voids present in the adhesive, and subsequently under a second set of conditions (pressure=$P^2$ and temperature=$T^2$) designed to bring about curing of the thermosetting resin; and setting the pressure $P^2$ of the second set of conditions at a lower level than the pressure $P^1$ of the first set of conditions, wherein $P^1$ and $P^2$ have a stepwise pressure profile and $T^1$ and $T^2$ have a stepwise temperature profile.

* * * * *